(12) United States Patent
Shi et al.

(10) Patent No.: US 11,893,942 B2
(45) Date of Patent: Feb. 6, 2024

(54) GOA UNIT CIRCUIT, DRIVING METHOD, GOA CIRCUIT, AND DISPLAY APPARATUS

(71) Applicant: BOE Technology Group Co., Ltd., Beijing (CN)

(72) Inventors: Lubin Shi, Beijing (CN); Ke Meng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 785 days.

(21) Appl. No.: 16/958,822

(22) PCT Filed: Sep. 17, 2019

(86) PCT No.: PCT/CN2019/106198
§ 371 (c)(1),
(2) Date: Jun. 29, 2020

(87) PCT Pub. No.: WO2021/051270
PCT Pub. Date: Mar. 25, 2021

(65) Prior Publication Data
US 2023/0142651 A1    May 11, 2023

(51) Int. Cl.
*G09G 3/3266* (2016.01)

(52) U.S. Cl.
CPC ... *G09G 3/3266* (2013.01); *G09G 2300/0408* (2013.01); *G09G 2310/08* (2013.01); *G09G 2330/021* (2013.01)

(58) Field of Classification Search
CPC .............. G09G 3/3266; G09G 3/3674; G09G 2300/0408; G09G 2310/0286; G09G 2310/08; G09G 2330/021
See application file for complete search history.

(56) References Cited

U.S. PATENT DOCUMENTS

| 8,229,058 B2 | 7/2012 | Tsai et al. |
| 9,396,691 B2 | 7/2016 | Zeng |

(Continued)

FOREIGN PATENT DOCUMENTS

| CN | 104240631 A | 12/2014 |
| CN | 104282287 A | 1/2015 |

(Continued)

OTHER PUBLICATIONS

International Search Report & Written Opinion dated Jun. 15, 2020, regarding PCT/CN2019/106198.

*Primary Examiner* — Benjamin C Lee
*Assistant Examiner* — Emily J Frank
(74) *Attorney, Agent, or Firm* — Intellectual Valley Law, P.C.

(57) ABSTRACT

A GOA unit circuit is provided with an input sub-circuit configured to set a turn-on voltage to a first node and a turn-off voltage to a second node in response to an input signal and a first clock signal; a first pull-down sub-circuit, a pull-up sub-circuit, a first control sub-circuit, and a second control sub-circuit configured to set voltage levels of the first, the second, and a third nodes. The gate on array unit circuit also includes a first output sub-circuit to output a first output signal at the turn-on voltage triggered by a second clock in response to voltage levels at the first, second nodes and a second output sub-circuit to output a second output signal falling to the turn-off voltage triggered by the first clock and rising to the turn-on voltage triggered by the third clock in response to voltage levels at the first, third nodes.

19 Claims, 9 Drawing Sheets

(56) References Cited

U.S. PATENT DOCUMENTS

| | | | |
|---|---|---|---|
| 2012/0105423 A1 | 5/2012 | Chung | |
| 2016/0125847 A1 | 5/2016 | Gu | |
| 2016/0259455 A1 | 9/2016 | Li et al. | |
| 2017/0160607 A1 | 6/2017 | Zhao et al. | |
| 2017/0162148 A1 | 6/2017 | Xiao et al. | |
| 2017/0193950 A1* | 7/2017 | Kim | G09G 3/3696 |
| 2018/0061350 A1 | 3/2018 | Sung et al. | |
| 2018/0174553 A1 | 6/2018 | Bong et al. | |
| 2019/0180690 A1* | 6/2019 | Kim | G09G 3/3266 |
| 2020/0020292 A1 | 1/2020 | Yuan et al. | |
| 2020/0058242 A1* | 2/2020 | Liu | H01L 27/1214 |
| 2020/0266809 A1 | 8/2020 | Shi et al. | |
| 2021/0013290 A1* | 1/2021 | Park | H01L 27/1255 |
| 2021/0057034 A1* | 2/2021 | Zhang | G09G 3/3677 |
| 2022/0335899 A1* | 10/2022 | Park | G09G 3/3266 |

FOREIGN PATENT DOCUMENTS

| | | |
|---|---|---|
| CN | 105223746 A | 1/2016 |
| CN | 107784983 A | 3/2018 |
| CN | 107980160 A | 5/2018 |
| CN | 108205999 A | 6/2018 |
| CN | 109192173 A | 1/2019 |
| CN | 109698006 A | 4/2019 |
| WO | 2017049659 A1 | 3/2017 |

\* cited by examiner

US 11,893,942 B2

GOA UNIT CIRCUIT, DRIVING METHOD, GOA CIRCUIT, AND DISPLAY APPARATUS

CROSS-REFERENCE TO RELATED APPLICATION

This application is a national stage application under 35 U.S.C. § 371 of International Application No. PCT/CN2019/106198, filed Sep. 17, 2019, the contents of which are incorporated by reference in the entirety.

TECHNICAL FIELD

The present invention relates to display technology, more particularly, to a GOA (gate-on-array) unit circuit and a driving method thereof, a GOA circuit with cascaded multiple stages of GOA unit circuits, and a display apparatus.

BACKGROUND

An active-matrix organic light emitting diode (AMOLED) display apparatus is advantageous with active light emitters without need of backlight source, high image contrast, and flexible panel body, and many other features. It has potential to become the next-generation display apparatus with development of higher PPI resolution and narrower panel border. One trend is to transfer gate-driving circuit from external integrated circuit directly to the display panel, making the display panel with a narrower border. The gate-driving circuit with cascaded gate on array units is typically to provide one gate-driving signal per unit. Yet, advanced design for the gate on array unit is desired to enhance capability to reduce border dimension further and increase PPI resolution of the AMOLED display panel.

SUMMARY

In an aspect, the present disclosure provides a gate on array unit circuit. The gate on array (GOA) unit circuit includes an input sub-circuit connected to a first node and configured to set a turn-on voltage level to the first node in response to an input signal and a first clock signal. Additionally, the GOA unit circuit includes a first pull-down sub-circuit connected to a second node and the first node and configured to pull down a voltage level at the second node to a turn-off voltage level in response to the turn-on voltage level at the first node. The GOA unit circuit also includes a pull-up sub-circuit connected to the second node and configured to set the turn-on voltage level to the second node in response to a third clock signal. The GOA unit circuit further includes a first control sub-circuit connected to the second node and a third node and configured to set a turn-on voltage level to the third node in response to the turn-on voltage level at the second node. Furthermore, the GOA unit circuit includes a second control sub-circuit connected to the first node and the third node, and configured to set a turn-off voltage level to the third node in response to the turn-on voltage level at the first node. The GOA unit circuit further includes a first output sub-circuit configured to output a first output signal at the turn-on voltage level triggered by a second clock signal through one period of a cycle time associated with the input signal in response to voltage levels at the second node and the first node. Moreover, the GOA unit circuit includes a second output sub-circuit configured to output a second output signal falling to the turn-off voltage level triggered by the first clock signal through at least the same one period of the cycle time before rising to the turn-on voltage level triggered by the third clock signal in response to voltage levels at the first node and the third node.

Optionally, the gate on array unit circuit further includes a second pull-down sub-circuit connected to the second node and the first node, and configured to pull down a voltage level at the first node to a turn-off voltage level in response to the turn-on voltage level at the second node.

Optionally, the gate on array unit circuit further includes a third pull-down sub-circuit connected to the first node and the third node, and configured to pull down a voltage level at the first node to a turn-off voltage level in response to the turn-on voltage level at the third node.

Optionally, the input sub-circuit includes a first transistor and a second transistor. The first transistor has a first terminal configured to receive a first voltage signal set at the turn-on voltage level, a gate terminal configured to receive the input signal, and a second terminal. The second transistor has a first terminal coupled to the second terminal of the first transistor, a gate terminal configured to receive the first clock signal, and a second terminal coupled to the first node.

Optionally, the input sub-circuit further includes a fifth transistor having a first terminal configured to receive a second voltage signal set at the turn-off voltage level, a gate terminal configured to receive the input signal, and a second terminal coupled to the second node.

Optionally, the pull-up sub-circuit includes a fourth transistor having a first terminal configured to receive a first voltage signal set at the turn-on voltage level, a gate terminal configured to receive the third clock signal, and a second terminal coupled to the second node.

Optionally, the first control sub-circuit includes a tenth transistor having a first terminal configured to receive a first voltage signal set at the turn-on voltage level, a gate terminal coupled to the second node, and a second terminal coupled to the third node.

Optionally, the second control sub-circuit includes a twelfth transistor having a first terminal configured to receive a second voltage signal set at the turn-off voltage level, a gate terminal coupled to the first node, and a second terminal coupled to the third node.

Optionally, the first pull-down sub-circuit includes a third transistor having a first terminal configured to receive a second voltage signal set at the turn-off voltage level, a gate terminal coupled to the first node, and a second terminal coupled to the second node.

Optionally, the second pull-down sub-circuit includes a seventh transistor having a first terminal configured to receive a second voltage signal set at the turn-off voltage level, a gate terminal coupled to the second node, and a second terminal coupled to the first node.

Optionally, the third pull-down sub-circuit includes an eleventh transistor having a first terminal configured to receive a second voltage signal set at the turn-off voltage level, a gate terminal coupled to the third node, and a second terminal coupled to the second node.

Optionally, the first output sub-circuit includes a ninth transistor, a sixth transistor, and a first capacitor respectively coupled to a first output terminal for outputting the first output signal. The ninth transistor has a first terminal configured to receive the second clock signal, a gate terminal coupled to a first terminal of the first capacitor, and a second terminal coupled to the first output terminal. The sixth transistor has a first terminal configured to receive a second voltage signal set at the turn-off voltage level, a gate terminal coupled to the second node, and a second terminal coupled to the first output terminal. The first capacitor has a second terminal coupled to the first output terminal.

Optionally, the first output sub-circuit further includes an eighth transistor having a first terminal coupled to the first node, a gate terminal configured to receive a first voltage signal set at the turn-on voltage level, and a second terminal coupled to the first terminal of the first capacitor and the gate terminal of the ninth transistor.

Optionally, the second output sub-circuit includes a thirteenth transistor, a fourteenth transistor, a third capacitor, and a fourth capacitor, and the thirteenth transistor, the fourteenth transistor and the third capacitor are respectively coupled to a second output terminal for outputting the second output signal. The thirteenth transistor has a first terminal configured to receive a first voltage signal set at the turn-on voltage level, a gate terminal coupled to the third node, and a second terminal coupled to the second output terminal. The fourteenth transistor has a first terminal configured to receive a second voltage signal set at the turn-off voltage level, a gate terminal coupled to the first node, and a second terminal coupled to the second output terminal. The third capacitor has a first terminal coupled to the third node and a second terminal coupled to the second output terminal. The fourth capacitor has a first terminal coupled to the first node and a second terminal coupled to the first terminal of the fourteenth transistor.

Optionally, the gate on array unit circuit further includes a second capacitor having a first terminal configured to receive a first voltage signal set at the turn-on voltage level and a second terminal coupled to the second node.

Optionally, the gate on array unit circuit further includes a second capacitor having a first terminal configured to receive a second voltage signal set at the turn-off voltage level and a second terminal coupled to the second node.

In another aspect, the present disclosure provides agate on array circuit including multiple gate on array unit circuits in a cascaded series associated with at least three clock-signal lines. A respective one of the multiple gate on array unit circuits includes a gate on array unit circuit described herein and configured to output a first output signal at a turn-on voltage level in one period of a cycle time associated with an input signal and a second output signal at the turn-off voltage level at least in the same one period of the cycle time before rising to the turn-on voltage level after the first output signal drops to the turn-off voltage level. The first output signal from a gate on array unit circuit in a previous stage in the cascaded series is inputted into a gate on array unit circuit in a present stage in the cascaded series as the input signal at the turn-on voltage level.

Optionally, the gate on array unit circuit in (N−2)-th stage is configured to receive a first clock signal from a first one of the three clock-signal lines, a second clock signal from a second one of the three clock-signal lines, and a third clock signal from a third one of the three clock-signal lines. The gate on array unit circuit in (N−1)-th stage is configured to receive a first clock signal from the second one of the three clock-signal lines, a second clock signal from the third one of the three clock-signal lines, and a third clock signal from the first one of the three clock-signal lines. The gate on array unit circuit in N-th stage is configured to receive a first clock signal from the third one of the three clock-signal lines, a second clock signal from the first one of the three clock-signal lines, and a third clock signal from the second one of the three clock-signal lines.

Optionally, the cascaded series is associated with four clock-signal lines. The gate on array unit circuit in (N−2)-th stage is configured to receive a first clock signal from a first one of the four clock-signal lines, a second clock signal from a second one of the four clock-signal lines, and a third clock signal from a fourth one of the four clock-signal lines. The gate on array unit circuit in (N−1)-th stage is configured to receive a first clock signal from the second one of the four clock-signal lines, a second clock signal from a third one of the four clock-signal lines, and a third clock signal from the first one of the four clock-signal lines. The gate on array unit circuit in N-th stage is configured to receive a first clock signal from the third one of the four clock-signal lines, a second clock signal from the fourth one of the four clock-signal lines, and a third clock signal from the second one of the four clock-signal lines. The gate on array unit circuit in (N+1)-th stage is configured to receive a first clock signal from the fourth one of the four clock-signal lines, a second clock signal from the first one of the four clock-signal lines, and a third clock signal from the third one of the four clock-signal lines.

In yet another aspect, the present disclosure provides a display apparatus including a display panel having multiple rows of subpixel circuits including light-emitting diodes and a gate on array circuit described herein with multiple gate on array unit circuits cascaded in series. A respective one of the multiple gate on array unit circuits is configured to output a first output signal to drive data loading to a respective one row of subpixel circuits and a second output signal to control the light-emitting diodes thereof.

In still another aspect, the present disclosure provides a method of driving a gate on array unit circuit in a cycle time. Transistors of the gate on array unit circuit are N-type transistors. The gate on array unit circuit is configured to receive a first voltage signal set at a high or turn-on voltage level for the N-type transistor and a second voltage signal set at a low or turn-off voltage level for the N-type transistor. The method includes a step of providing a first clock signal and an input signal at a high voltage level to an input sub-circuit to start a first period of the cycle time while keeping a second clock signal to a first output sub-circuit and a third clock signal to a pull-up sub-circuit at a low voltage level, thereby setting a first node to the high voltage level, a second node to the low voltage level, and a third node to the low voltage level, and outputting a first output signal at the low voltage level and a second output signal at the low voltage level. The method further includes a step of providing a second clock signal at the high voltage level to start a second period of the cycle time while changing the first clock signal and the input signal to the low voltage level and keeping the third clock signal at the low voltage level, thereby keeping the first node at the high voltage level, the second node at the low voltage level, and the third node at the low voltage level, and outputting the first output signal at the high voltage level and the second output signal at the low voltage level. Additionally, the method includes providing a third clock signal at the high voltage level to start a third period of the cycle time while keeping the first clock signal, the second clock signal, and the input signal at the low voltage level, thereby setting the second node to the high voltage level, the third node to the high voltage level and changing the first node to the low voltage level, and outputting the first output signal at the low voltage level and the second output signal at the high voltage level. The method further includes a step of providing the first clock signal again at the high voltage level to start a fourth period of the cycle time while keeping the second clock signal, the input signal, and the third clock signal at the low voltage level, thereby keeping the first node at the low voltage level, the second node and the third node at the high voltage level, and outputting the first output signal at the low voltage level and the second output signal at the high voltage level. Furthermore, the method includes a step of providing the second clock signal again at the high voltage level to start a fifth period of the cycle time while changing the first clock signal to the low voltage level and keeping the third clock signal and the input signal to the low voltage level, thereby keeping the first node at the low voltage level, the second node and the third node at the high voltage level, and outputting the first output signal at the low voltage level and the second output signal at the high voltage level. Moreover, the method includes a step of providing the third clock signal again at the high voltage level to start a sixth period of the cycle time while changing the second clock signal to the low voltage level and keeping the first clock signal and the input signal at the low voltage level, thereby keeping the first node at the low voltage level, the second node and the third node at the high voltage level, and outputting the first output signal at the low voltage level and the second output signal at the high voltage level.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

An active-matrix organic light emitting diode (AMOLED) display apparatus employs an active light-emitting diode in a subpixel circuit which is driven by a gate-driving circuit to emit light for respective one subpixel without need of back panel light source, giving many advantages of displaying high-contrast image with flexible panel designs. One trend is to move the gate-driving circuit directly to the display panel for driving subpixel circuits in the display panel. Typical gate-driving circuit is constructed by cascading multiple stages of gate on array unit circuit s. Thus, a simplified gate on array unit circuit design can help to make the display panel with narrower border and higher PPI resolution.

Accordingly, the present disclosure provides, inter alia, a gate on array unit circuit capable of outputting two gate-driving signals per unit and a driving method thereof, a gate on array (GOA) circuit cascaded by multiple gate on array unit circuits and a display apparatus having the same, and the driving method substantially obviates one or more of the problems due to limitations and disadvantages of the related art. In one aspect, the present disclosure provides a gate on array unit that is capable of providing two gate-driving signals per unit for driving both data loading and light emission for a subpixel circuit based on light-emitting diode in a display panel of an organic light emitting diode (OLED) display apparatus.

Figure 1:
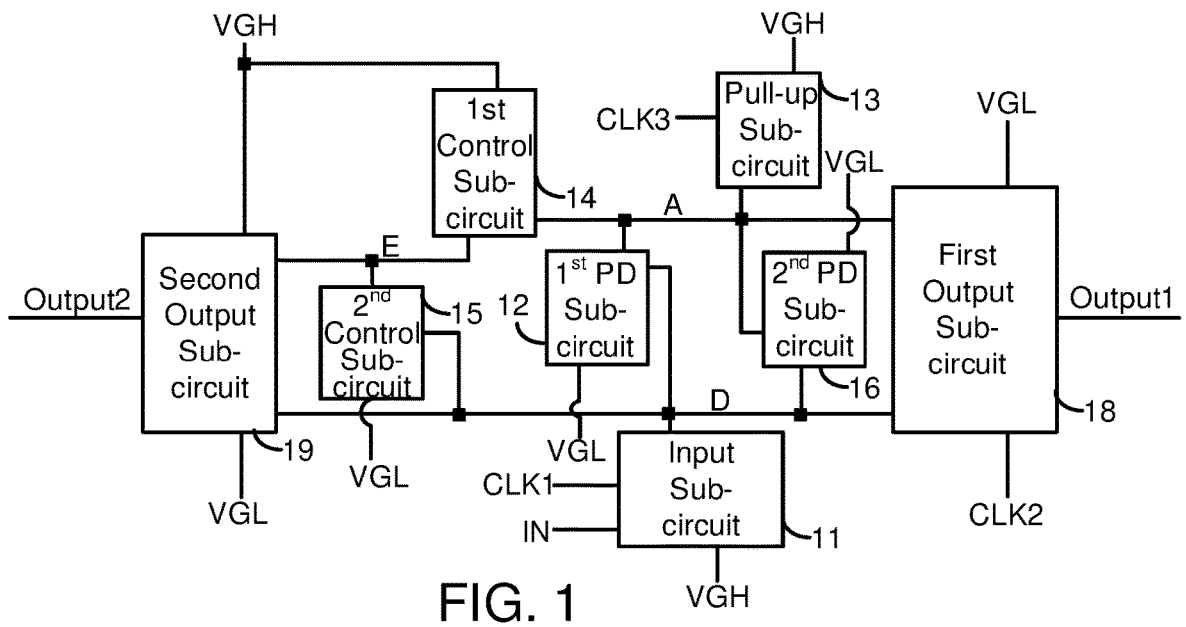
FIG. 1 is a block diagram of a gate on array unit circuit according to some embodiments of the present disclosure.

FIG. 1 shows a block diagram of a gate on array unit circuit according to some embodiments of the present disclosure. Referring to FIG. 1, the gate on array (GOA) unit circuit is functionally constructed by several sub-circuits to generate two output signals based on three clock signals, one input signal in a cycle time, and two fixed voltage signals. In an embodiment, the GOA unit circuit includes an input sub-circuit 11 connected to a first node D and configured to set a turn-on voltage level to the first node D in response to an input signal IN and a first clock signal CLK1. Optionally, the turn-on voltage level is provided by a first voltage signal from a fixed voltage supply VGH. Optionally, the turn-on voltage level is a high voltage level. For example, the voltage supply VGH is provided by a first power supply set with a high voltage output.

The GOA unit circuit further includes a first pull-down (PD) sub-circuit 12 connected to a second node A and the first node D, and configured to pull down a voltage level at the second node A to a turn-off voltage level in response to the turn-on voltage level at the first node D. Optionally, the turn-off voltage level is provided by a second voltage signal from a fixed voltage supply VGL. Optionally, the turn-off voltage level is a low voltage level. For example, the voltage supply VGL is provided by a second power supply set with a low voltage output or grounded. Optionally, the GOA unit circuit also includes a second pull-down (PD) sub-circuit 16 connected to the second node A and the first node D, and configured to pull down a voltage level at the first node D to the turn-off voltage level in response to the turn-on voltage level at the second node A.

Additionally, the GOA unit circuit further includes a pull-up sub-circuit 13 connected to the second node A and configured to set the turn-on voltage level supplied by the first voltage signal to the second node A in response to a third clock signal CLK3.

Furthermore, the GOA unit circuit includes a first control sub-circuit 14 connected to the second node A and a third node E and configured to set the turn-on voltage level to the third node E in response to the turn-on voltage level at the second node A. The GOA unit circuit also includes a second control sub-circuit 15 connected to the first node D and the third node E, and configured to set the turn-off voltage level to the third node E in response to the turn-on voltage level at the first node D.

Moreover, the GOA unit circuit as referred in FIG. 1, includes a first output sub-circuit 18 configured to output a first output signal to a first output terminal Output1 substantially in-phase with a second clock signal CLK2 in a cycle time associated with the input signal IN in response to voltage levels at the second node A and the first node D. The GOA unit circuit also includes a second output sub-circuit 19 configured to output a second output signal to a second output terminal Output2 substantially anti-phase with the first clock signal CLK1 and the second clock signal CLK2 in the cycle time in response to voltage levels at the first node D and the third node E.

In some embodiments, the GOA unit circuit disclosed in FIG. 1 can be achieved using thin-film transistors that can be implemented directly in a display panel, especially, OLED-based display panel, to control image data loading and drive light-emitting diodes in respective subpixel circuits to emit light for image display. In general, both P-type transistors and N-type transistors can be used for constructing the GOA unit circuit. In fact, for most OLED display panel for smart phone applications, P-type transistors based on low-temperature poly-silicon (LTPS) process have been widely employed. However, N-type transistor based on LTPS process has higher carrier mobility and weaker hysteresis effect, thereby better suitable for designing high PPI display panel. In all embodiments shown below, all transistors are N-type transistors for illustration purpose and for the benefit mentioned above. Correspondingly, the N-type transistor can act as a switch transistor to be turned on (to a conduction state) by a high voltage control signal at its gate terminal. The high voltage level is also called a turn-on voltage level. Alternatively, the N-type transistor can be turned off (to a block state) by a low voltage control signal at its gate terminal. The low voltage level is thereby called a turn-off voltage level.

Figure 2:
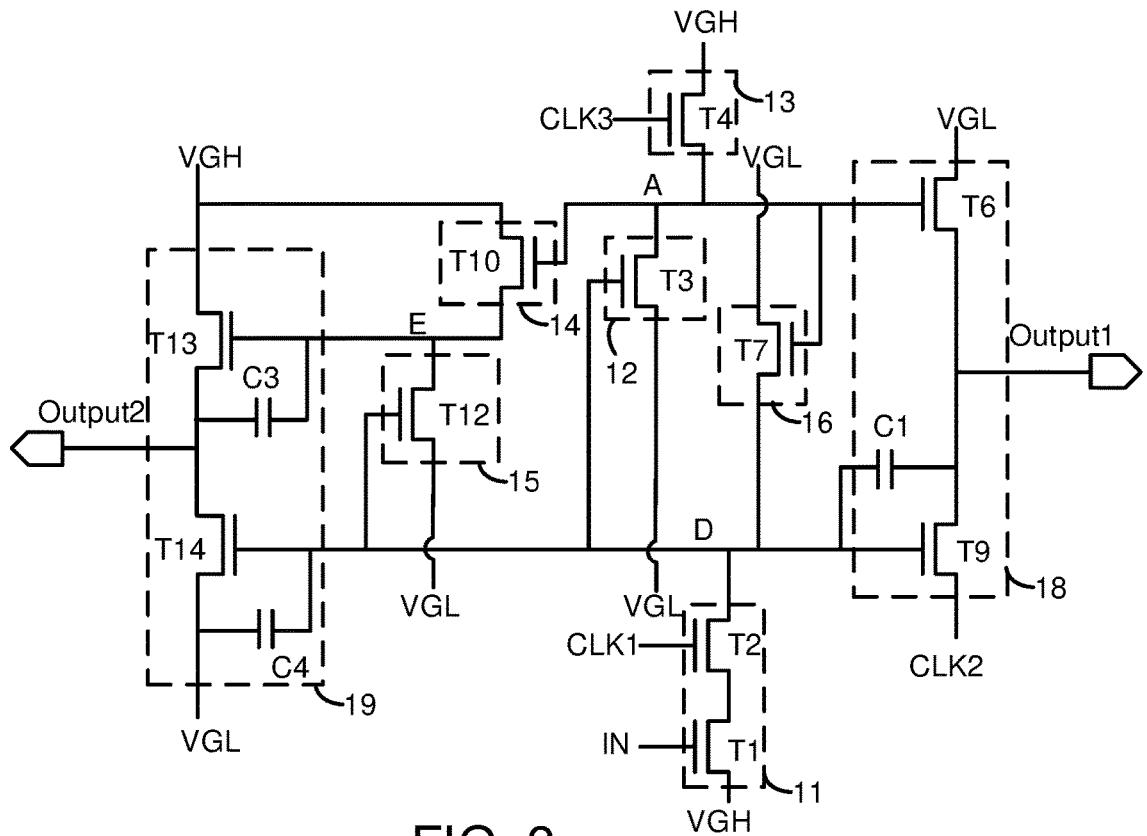
FIG. 2 is a circuit diagram of a gate on array unit circuit according to an embodiment of the present disclosure.
Figure 3:
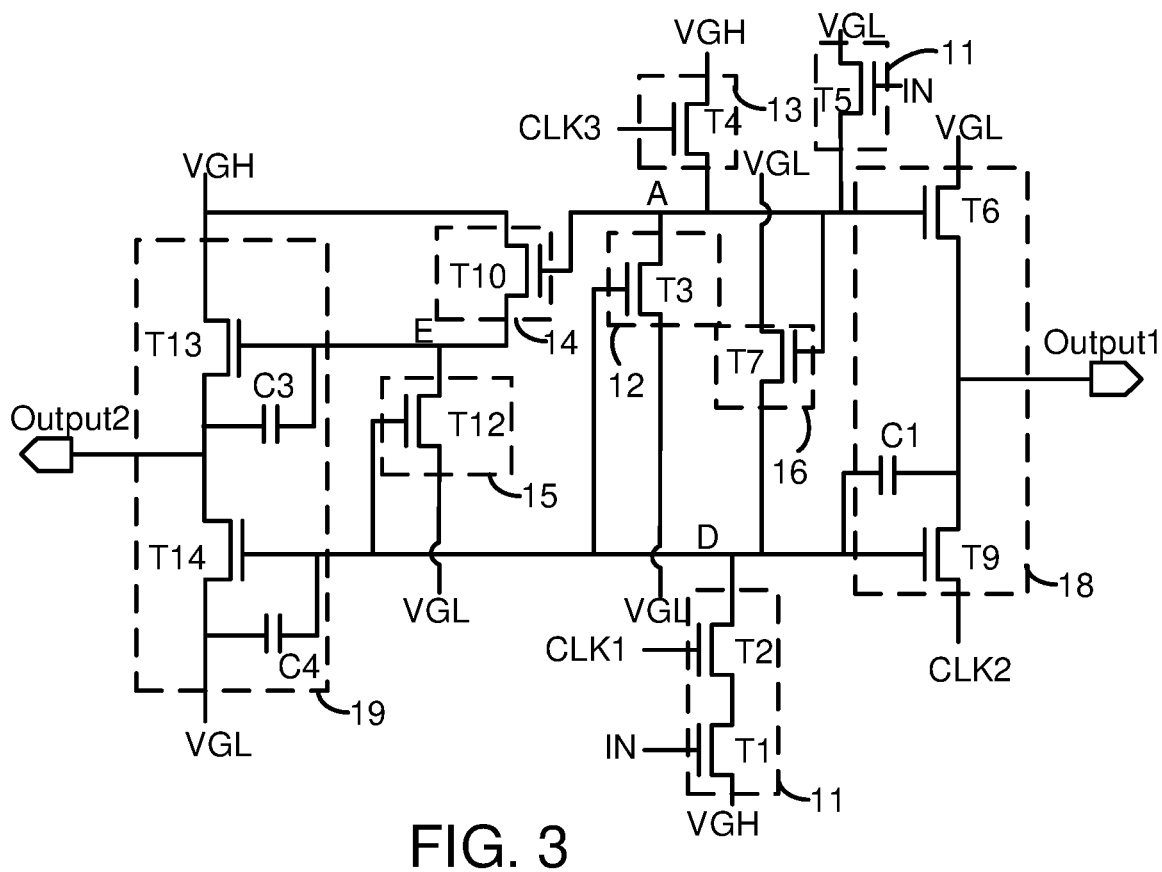
FIG. 3 is a circuit diagram of a gate on array unit circuit according to an embodiment of the present disclosure.
Figure 4:
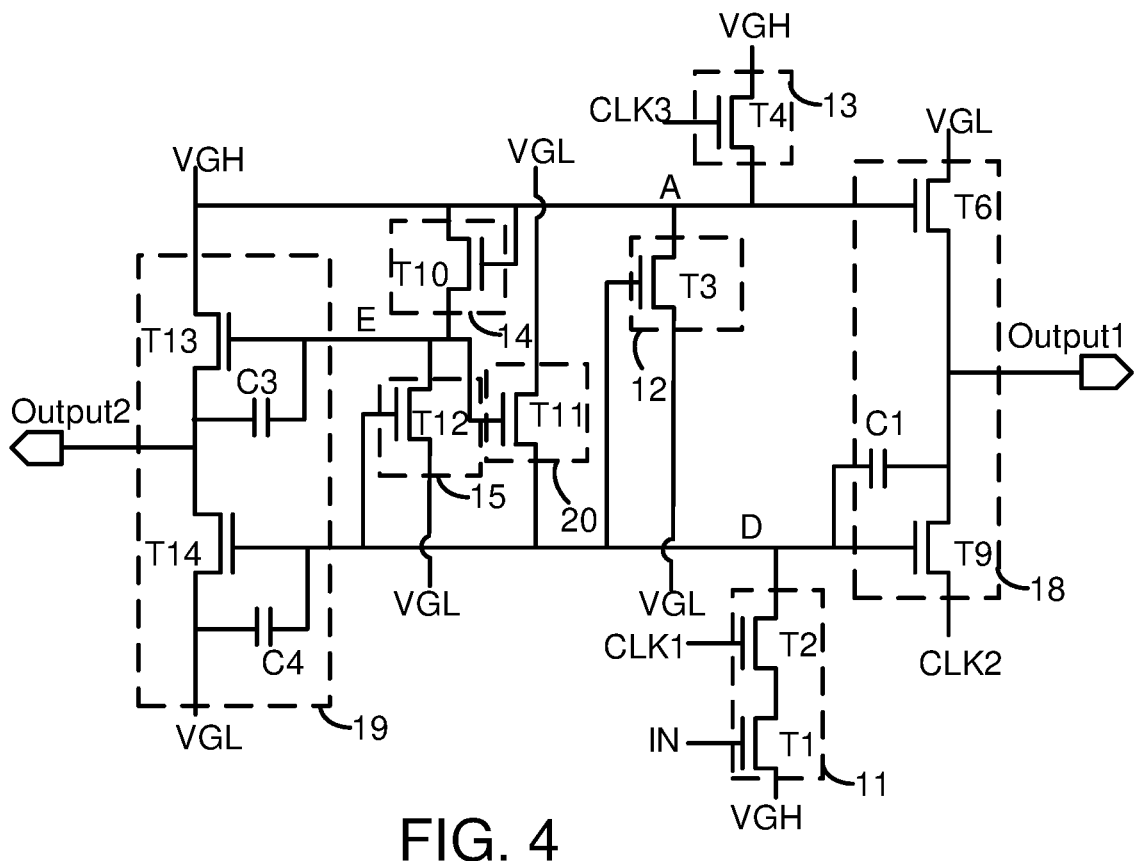
FIG. 4 is a circuit diagram of a gate on array unit circuit according to an embodiment of the present disclosure.
Figure 5:
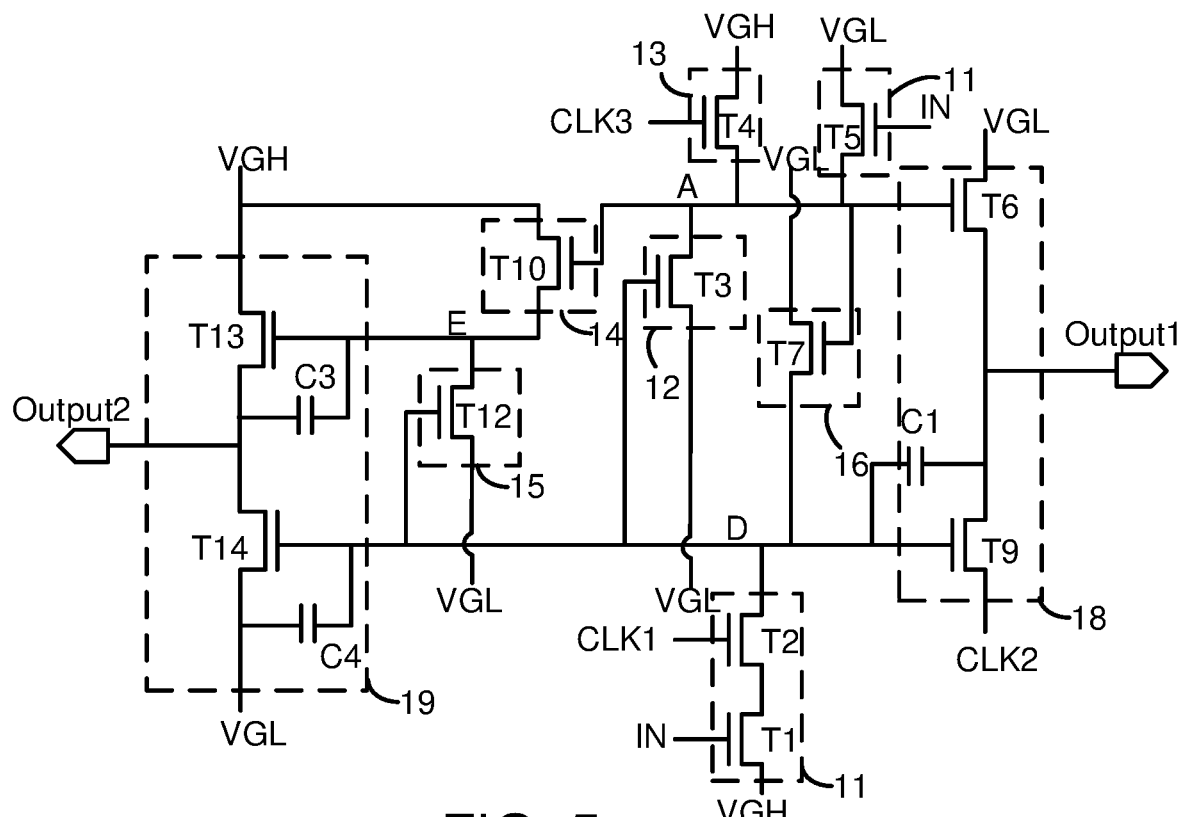
FIG. 5 is a circuit diagram of agate on array unit circuit according to an embodiment of the present disclosure.
Figure 6:
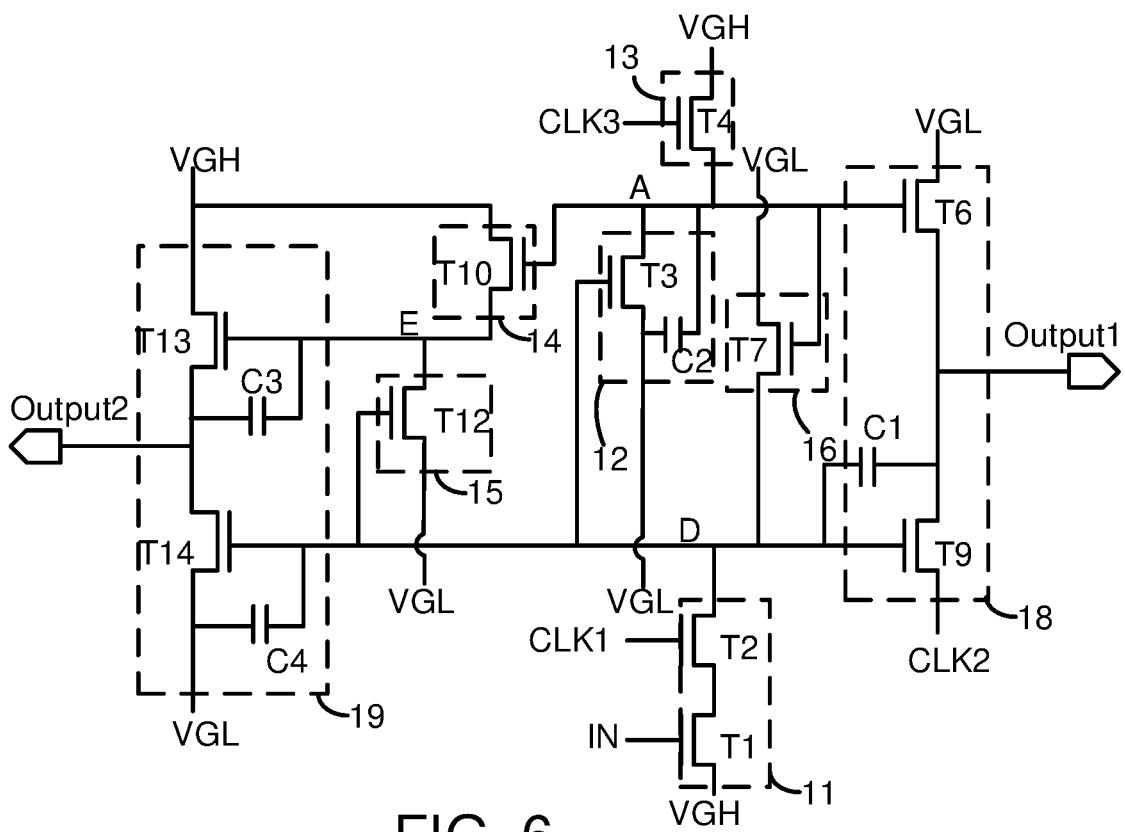
FIG. 6 is a circuit diagram of a gate on array unit circuit according to an embodiment of the present disclosure.
Figure 7:
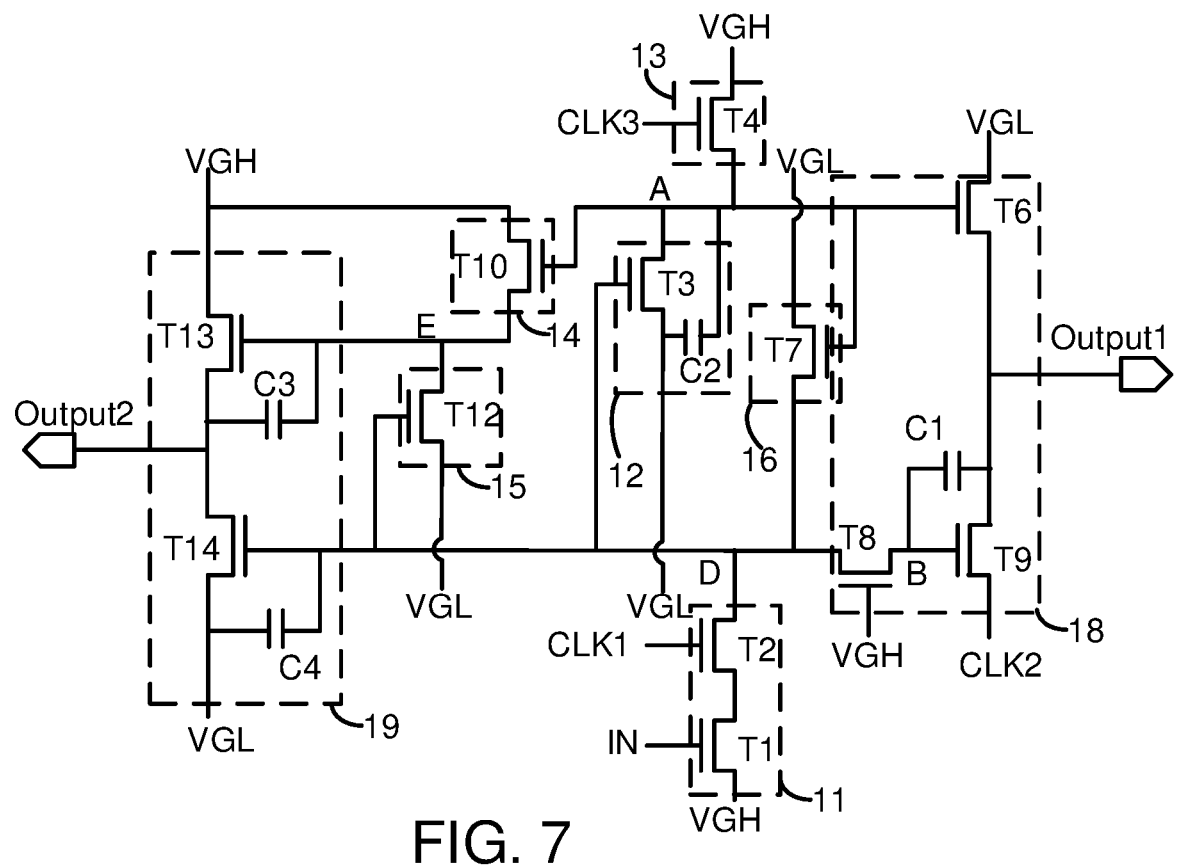
FIG. 7 is a circuit diagram of a gate on array unit circuit according to an embodiment of the present disclosure.

In an embodiment, FIG. 2 shows a GOA unit circuit, based on circuit block diagram of FIG. 1, having 11 transistors, three capacitors, and operated under three clock signals, one input signal, and two voltage signals. Referring to FIG. 1 and FIG. 2, the input sub-circuit 11 of the GOA unit circuit shown in FIG. 1 is achieved with two transistors coupled in series. A first transistor T1 has a first terminal configured to receive a first voltage signal set at a fixed high voltage level VGH, which can be from a first power supply or a voltage source. T1 also has a gate terminal configured to receive an input signal IN, which is a voltage pulse provided externally. In certain embodiments when the GOA unit circuit is used as one stage of a cascaded GOA circuit, the input signal IN may be an input signal outputted from another stage of the cascaded GOA circuit. Further, T1 has a second terminal that is set to be coupled with a first terminal of a second transistor T2. T2 has a gate terminal configured to receive a first clock signal CLK1 and a second terminal coupled to the first node D. In application, when a high voltage level pulse comes with the first clock signal CLK1 and the high voltage pulse is provided as the input signal IN, both T1 and T2 are turned on, the high voltage level of the first voltage signal is passed to the first node D.

Referring to FIG. 1 and FIG. 2, the first PD sub-circuit 12 of the GOA unit circuit of FIG. 1 is achieved by at least having a third transistor T3. The third transistor T3 has a first terminal configured to receive a second voltage signal supplied by a second power supply set with a low voltage level VGL. T3 also has a gate terminal coupled to the first node D and a second terminal coupled to a second node A. When the first node D is set to a high or turn-on voltage level (i.e., by the input sub-circuit 11), the third transistor T3 is turned on to allow the low voltage level being passed to the second node A. In an alternative embodiment, as shown in embodiments of FIG. 6, FIG. 7, FIG. 8, and FIG. 9, the first PD sub-circuit 12 of the GOA unit circuit also includes a second capacitor C2. The second capacitor C2 has a first terminal configured to receive the second voltage signal set at the turn-off voltage level VGL (e.g., supplied from the second power supply) and a second terminal coupled to the second node A. The second capacitor C2 is set to stabilize the voltage level at the second node A.

Optionally, as shown in FIG. 3, FIG. 5, FIG. 9, and FIG. 10 the input sub-circuit 11 of the GOA unit circuit may include a fifth transistor T5 connected to the second node A for directly writing a low or turn-off voltage level to there. The fifth transistor T5 has a first terminal configured to receive a second voltage signal provided via the second power supply set to the turn-off voltage level VGL. The fifth transistor T5 also has a gate terminal configured to receive the input signal IN and a second terminal coupled to the second node A. Setting the fifth transistor T5 directly to the second node A can enhance speed of charging or discharging to the second node A and overall stability of the GOA unit circuit.

Referring to FIG. 1 and FIG. 2, the pull-up sub-circuit 13 of the GOA unit circuit of FIG. 1 includes a fourth transistor T4. The fourth transistor T4 has a first terminal configured to receive the first voltage signal supplied from the first power supply being set at the high or turn-on voltage level VGH. T4 also has a gate terminal configured to receive a third clock signal CLK3 and a second terminal coupled to the second node A. In case that a high voltage level pulse comes with the third clock signal CLK3, the fourth transistor T4 is turned on to allow the high voltage level VGH be passed to the second node A. Alternatively, as shown in embodiments of FIG. 10, the pull-up sub-circuit 13 also includes a second capacitor C2 having a first terminal configured to be set at the high voltage level VGH and a second terminal coupled to the second node A. The second capacitor C2 is set to stabilize the voltage level at the second node A.

Referring to FIG. 1 and FIG. 2, the second PD sub-circuit 16 of the GOA unit circuit of FIG. 1 includes a seventh transistor T7. The seventh transistor T7 has a first terminal configured to receive the second voltage signal supplied from the second power supply being set at the low or turn-off voltage level VGL. T7 also has a gate terminal coupled to the second node A and a second terminal coupled to the first node. When the second node A is set to a high or turn-on voltage level (i.e., by the pull-up sub-circuit 13), the seventh transistor T7 is turned on to allow the low voltage level being passed to the first node D.

Referring to FIG. 1 and FIG. 2, the first control sub-circuit 14 of the GOA unit circuit of FIG. 1 is achieved by having a tenth transistor T10. The tenth transistor T10 has a first terminal configured to receive the first voltage signal supplied from the first power supply being set at the high or turn-on voltage level VGH. T10 also has a gate terminal coupled to the second node A and a second terminal coupled to the third node E. When the second node A is set to a high or turn-on voltage level (i.e., by the pull-up sub-circuit 13), the tenth transistor T10 is turned on to allow the high voltage level being passed to the third node E.

Referring to FIG. 1 and FIG. 2, the second control sub-circuit 15 of the GOA unit circuit of FIG. 1 is achieved by having a twelfth transistor T12. The twelfth transistor T12 has a first terminal configured to receive the second voltage signal supplied from the second power supply being set at the low or turn-off voltage level VGL. T12 also has a gate terminal coupled to the first node D and a second terminal coupled to a third node E. When the first node D is set to a high or turn-on voltage level (i.e., by the input sub-circuit 11), the twelfth transistor T12 is turned on to allow the low voltage level being passed to the third node E.

Referring again to FIG. 1 and FIG. 2, the first output sub-circuit 18 of the GOA unit circuit of FIG. 1 is achieved by having at least two transistors, a sixth transistor T6 and a ninth transistor T9, and a first capacitor C1. The sixth transistor T6 has a first terminal configured to receive the second voltage signal supplied from the second power supply being set at the low or turn-off voltage level VGL. The sixth transistor T6 also has a gate terminal coupled to the second node A and a second terminal coupled to the first output terminal Output. The ninth transistor T9 has a first terminal configured to receive a second clock signal CLK2, a gate terminal coupled to a first terminal of the first capacitor C1 and commonly coupled to the first node D, and a second terminal coupled to the second terminal of the first capacitor C1 and commonly coupled to the first output terminal Output1. Once a high voltage level pulse comes with the second clock signal CLK2 in one period of an operation cycle (as a function unit of a GOA circuit for driving the subpixel circuits in the display panel) and a turn-on voltage level is kept at the first node D, the ninth transistor T9 is able to be turned on to pass the high voltage level to its second terminal, which is then outputted as a first output signal at the high voltage level. In fact, during this period the turn-on voltage level at the first node D pulls down the voltage level of the second node A by the first PD sub-circuit 12 via the third transistor T3. Thereby, the sixth transistor T6 is turned off. Alternatively (in a different period of the operation cycle), once the second node A is set to the turn-on voltage level, for example, by the pull-up sub-circuit 13 triggered by the third clock signal CLK3, the sixth transistor T6 can be turned on to pass the low voltage level to its second terminal, which is then outputted as a first output signal at the low voltage level. In fact, during this different period the turn-on voltage level at the second node A pulls down the voltage level at the first node D by the second PD sub-circuit 16 via the seventh transistor T7. Thereby, the ninth transistor T9 is turned off.

Optionally, the high voltage level is outputted via the first output terminal Output1 in one period of the operation cycle that is triggered by the second clock signal CLK2. In other words, the first output signal is outputted at the high voltage level substantially in phase with the high voltage pulse of the second clock signal in the one period, i.e., rising to the high voltage level substantially same as the rising edge of the second clock signal and falling to the low voltage level substantially same as the falling edge of the second clock signal in this one period.

Figure 8:
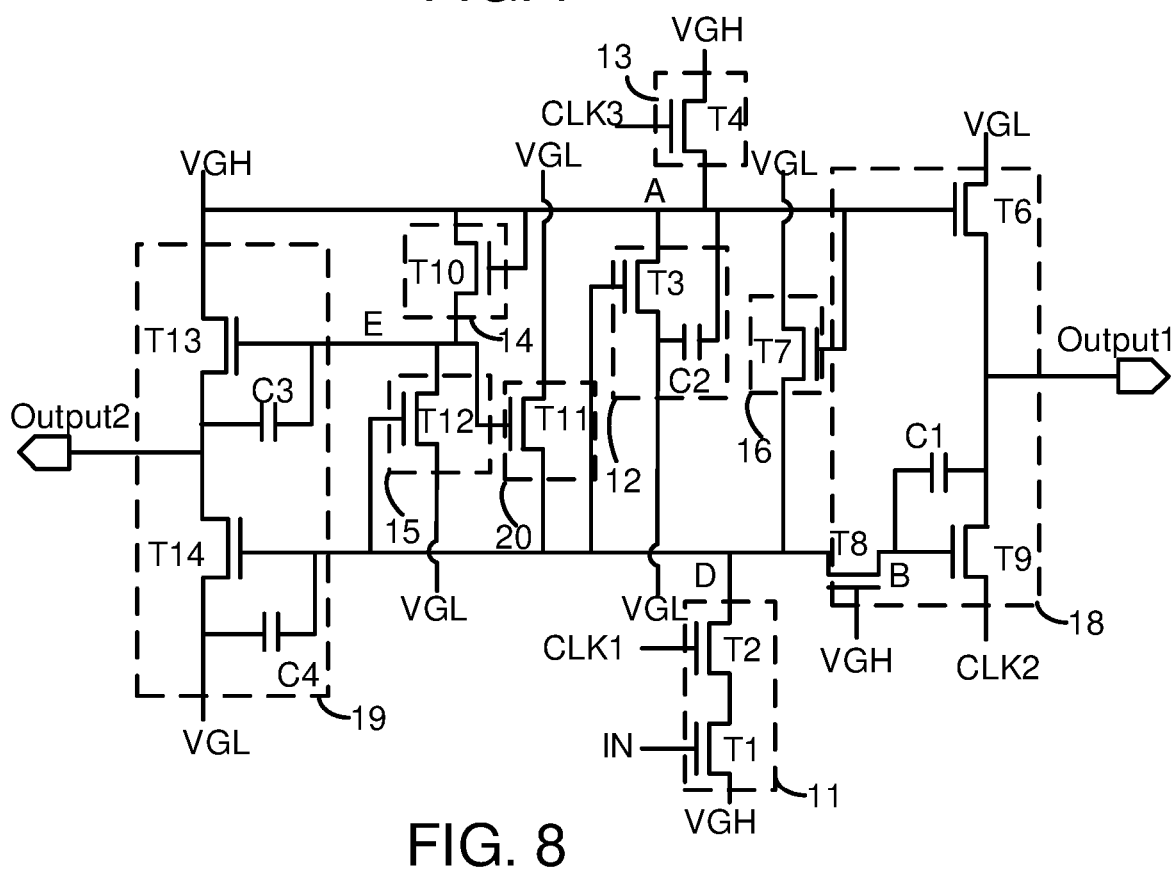
FIG. 8 is a circuit diagram of a gate on array unit circuit according to an embodiment of the present disclosure.
Figure 9:
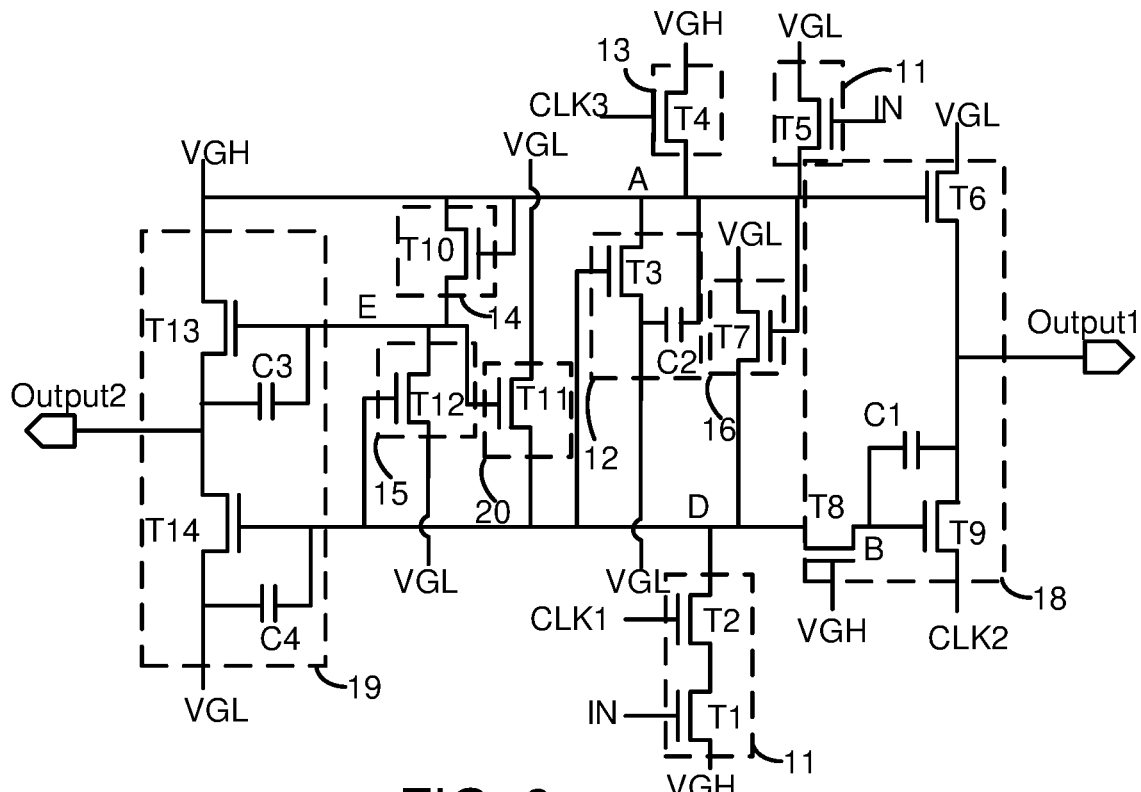
FIG. 9 is a circuit diagram of a gate on array unit circuit according to an embodiment of the present disclosure.
Figure 10:
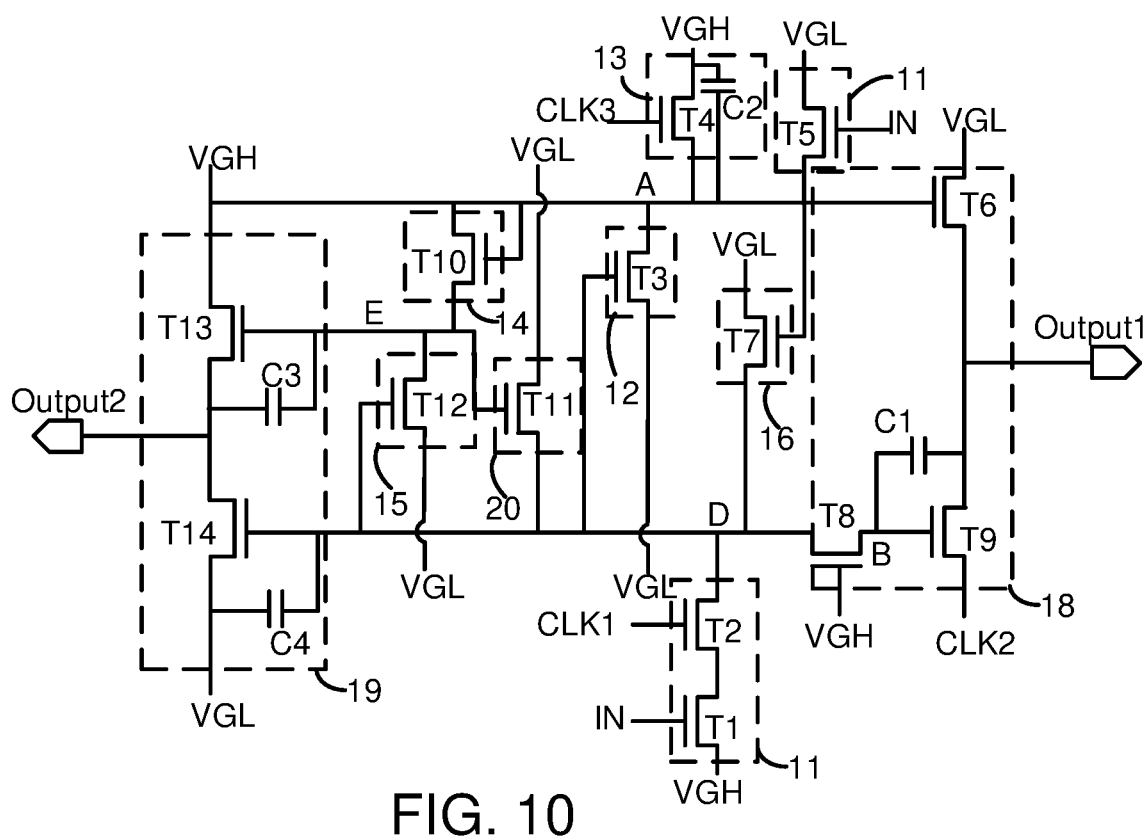
FIG. 10 is a circuit diagram of a gate on array unit circuit according to an embodiment of the present disclosure.

In some alternative embodiments, referring to FIGS. 4, 8, 9, and 10, the pull-down function of the seventh transistor T7 can be replaced or compensated by a third pull-down sub-circuit 20 (not shown in FIG. 1 and FIG. 2). In the embodiments shown, the third pull-down sub-circuit 20 includes an eleventh transistor T11 coupled between the first node D and the third node E. In particular, the eleventh transistor T11 has a first terminal configured to receive the second voltage signal supplied from the second power supply being set at the low or turn-off voltage level VGL. The eleventh transistor T11 also has a gate terminal coupled to the third node E and a second terminal coupled to the first node D. Once the second node A is set to the turn-on or high voltage level in a certain operation period as described earlier, the tenth transistor T10 can be turned on to pass the high voltage level VGH to the third node E. The high voltage level at the third node E is able to control the eleventh transistor T11 to be in a conduction state, pass the low voltage level to the first node D, achieving a same pull-down function as the seventh transistor T7. Optionally, as shown in FIGS. 8, 9, and 10, both the eleventh transistor T11 and the seventh transistor T7 can be used in the GOA unit circuit while each of them can be made with a smaller size to reduce area in the border region for overall GOA circuit. In other embodiments, only the seventh transistor T7 is used in FIG. 2, 3, 7; only the eleventh transistor T11 is used in FIG. 4.

In another alternative embodiment, the first output sub-circuit 18 also includes an eighth transistor T8 connected between the first node D and a fourth node B, i.e., the gate terminal of the ninth transistor T9. The eighth transistor T8 has its first terminal coupled to the first node D and a second terminal coupled to the fourth node B. The eighth transistor T8 has a gate terminal configured to receive the first voltage signal set to the turn-on voltage level VGH from the first power supply. The eighth transistor T8, although it is set to connect the first node D and the fourth node B, separates the two nodes. When a high voltage level pulse comes with the second clock signal CLK2, the fourth node B is pulled up by coupling effect. Because of the setting of the eighth transistor T8, the first node D at this time is not pulled up higher as the fourth node B. Thus, it may reduce high-voltage stresses over time applied on other transistors in the GOA unit circuit such as T3, T12, and T14 that are coupled to the first node D. In embodiments shown in FIGS. 7, 8, 9, and 10, the eighth transistor T8 is used in the first output sub-circuit 18.

Referring again to FIG. 1 and FIG. 2, the second output sub-circuit 19 of the GOA unit circuit of FIG. 1 is achieved by having at least two transistors, a thirteenth transistor T13 and a fourteenth transistor T14, and two capacitors, a third capacitor C3 and a fourth capacitor C4. The thirteenth transistor T13 has a first terminal configured to receive the first voltage signal set at the turn-on voltage level VGH, a gate terminal coupled to the third node E, and a second terminal coupled to the second output terminal Output2. The fourteenth transistor T14 has a first terminal configured to receive the second voltage signal set at the turn-off voltage level VGL, a gate terminal coupled to the first node D, and a second terminal coupled to the second output terminal Output2. The third capacitor C3 has a first terminal coupled to the third node E and a second terminal coupled to the second output terminal Output2. The fourth capacitor C4 has a first terminal coupled to the first node D and a second terminal coupled to the first terminal of the fourteenth transistor T14 which is configured to receive the second voltage signal set at the turn-off voltage level VGL.

Optionally, when the first node D is set to the high or turn-on voltage level triggered by the first clock signal CLK1 and preserved by the fourth capacitor C4, the fourteenth transistor T14 is turned on to allow the low voltage level VGL to pass to its second terminal, thereby outputting a second output signal to the second output terminal Output2 at the low voltage level. In other words, the second output signal has a falling edge triggered by a rising edge of the first clock signal CLK1. In fact, at this time, the third node E is pulled down to the turn-off voltage level by the second control sub-circuit 15 via the twelfth transistor T12. Thus, the turn-off voltage level at the third node E preserved by the third capacitor C3 keeps the thirteenth transistor T13 in an off state in this period.

As long as the third node E is kept at the turn-off voltage level, the second output signal will be at the low voltage level. The third node E will be kept at the turn-off voltage level until the third clock CLK3 supplies a high voltage level pulse which sets the second node A to the turn-on voltage level. Once the third node E is at the turn-on voltage level preserved by the third capacitor C3, the thirteenth transistor T13 is turned on to allow the high voltage level VGH to pass to its second terminal, thereby outputting a second output signal to the second output terminal Output2 at the high voltage level. In other words, the second output signal has a rising edge triggered by the third clock signal CLK3. In fact, at this time, the first node D is pulled down to the turn-off voltage level by the second PD sub-circuit 16 via the seventh transistor T7 when the second node A is at the turn-on voltage level. Thus, the fourteenth transistor T14 is turned off at this time. In general, the second output signal is outputted at the low voltage level between the rising edge of the first clock signal CLK1 and a rising edge of the third clock signal CLK3.

In some embodiments, the gate on array unit circuit of FIG. 1, through embodiments shown in FIGS. 2-10 with all (11 up to 14) N-type transistors, is shown to output a first output signal and a second output signal under control of three clock signals (CLK1, CLK2, and CLK3), two fixed voltage signals (VGH and VGL), and one input signal (IN) in respective one of a plurality of operation cycles. Optionally, the first clock signal CLK1 has a high voltage pulse in a first period of one operation cycle. The second clock signal CLK2 has a high voltage pulse in a second period following the first period (or with a certain delay) of the operation cycle. The third clock signal CLK3 has a high voltage pulse in a third period following the second period (or with a certain delay) of the operation cycle. The first output signal is a high voltage pulse in-phase with the high voltage pulse of the second clock signal CLK2, The second output signal is at a low voltage level triggered by the rising edge of the first clock signal CLK1 and the rising edge of the third clock signal CLK3.

Figure 12:
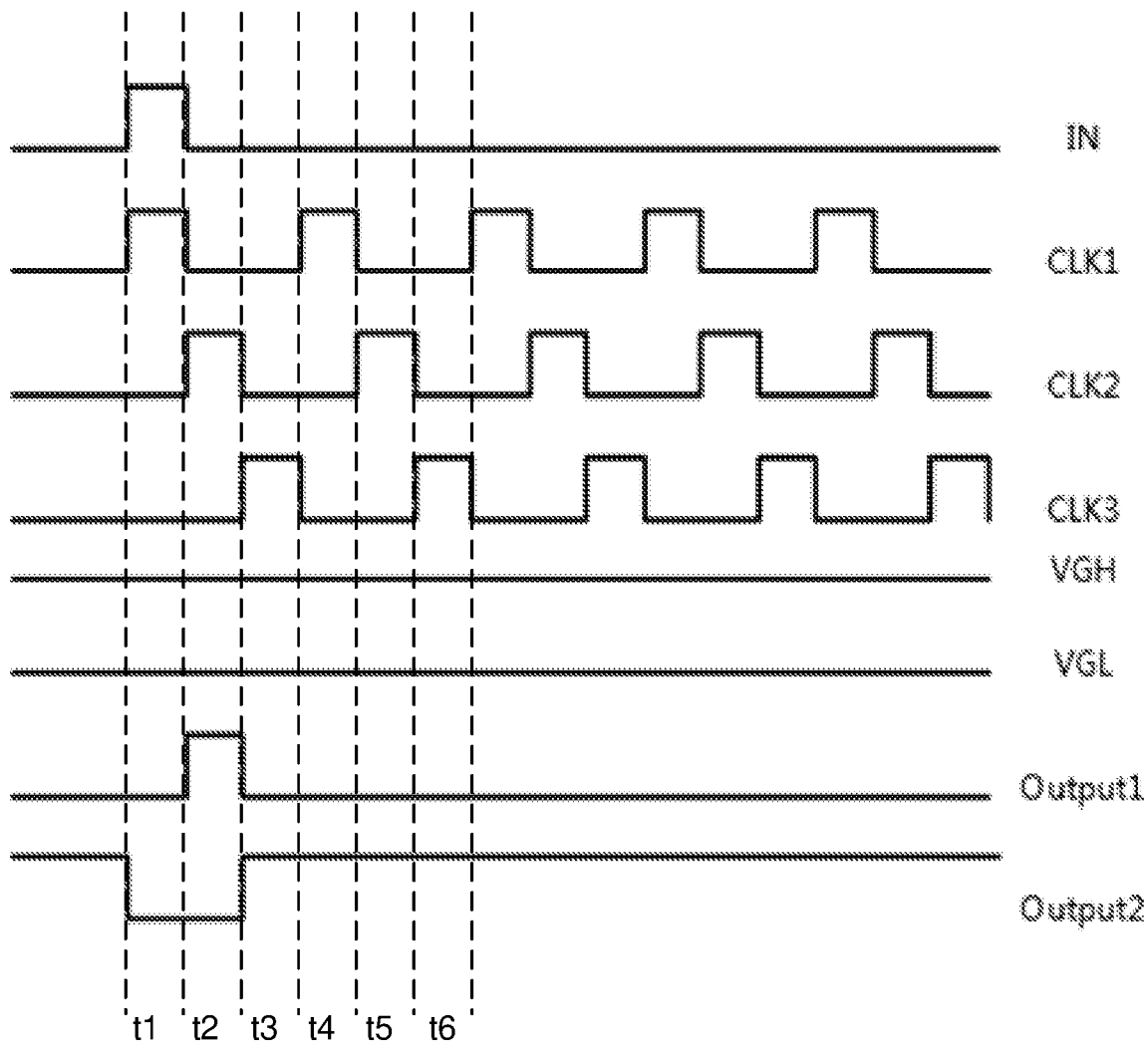
FIG. 12 is a timing waveform diagram of control signals for driving the gate on array unit circuit to output two output signals according to an embodiment of the present disclosure.

In another aspect, the present disclosure (or the brief description above) provides a method for driving the gate on array unit (of FIG. 1, through embodiments shown in FIGS. 2-10). FIG. 12 shows a timing diagram of operating the gate on array unit to output two output signals based on three clock signals in the embodiments described above. Referring to FIG. 12, the operation cycle time includes 6 periods as timings of the three clock signals are arranged. The method includes a step of providing a first clock signal CLK1 and an input signal IN as high voltage level pulses in a first period t1 of the cycle time while keeping a second clock signal CLK2 and a third clock signal at the low voltage level VGL. The step further includes setting a first node to the high voltage level VGH, a second node to the low voltage level VGL, and a third node to the low voltage level VGL. The step further includes outputting a first output signal at the low voltage level VGL and a second output signal at the low voltage level VGL in response to the voltages set at the first node, the second node, and the third node.

The method further includes a step of providing a second clock signal CLK2 as a high voltage level pulse in a second period t2 of the cycle time while changing the first clock signal CLK1 and the input signal IN to the low voltage level and keeping the third clock signal CLK3 at the low voltage level. The step further includes keeping the first node at the high voltage level VGH, the second node at the low voltage level VGL, and the third node at the low voltage level VGL. The step also includes outputting the first output signal at the high voltage level VGH and the second output signal at the low voltage level VGL in response to the voltages set at the first node, second node, and the third node.

Additionally, the method includes a step of providing a third clock signal CLK3 as a high voltage level pulse in a third period of the cycle time while keeping the first clock signal CLK1, the second clock signal CLK2, and the input signal IN at the low voltage level. The step further includes setting the second node to the high voltage level VGH, the third node to the high voltage level VGH and changing the first node to the low voltage level VGL. The step also includes outputting the first output signal at the low voltage level VGL and the second output signal at the high voltage level VGH in response to the voltages set to the first node, the second node, and the third node.

The method further includes a step of providing the first clock signal CLK1 again at the high voltage level to start a fourth period t4 of the cycle time while keeping the second clock signal CLK2, the input signal IN, and the third clock signal CLK3 at the low voltage level. The step also includes keeping the first node at the low voltage level VGL, the second node and the third node at the high voltage level VGH. The step further includes outputting the first output signal at the low voltage level VGL and the second output signal at the high voltage level VGH in response to the voltages set at the first node, the second node, and the third node.

Furthermore, the method includes a step of providing the second clock signal CLK2 again at the high voltage level to start a fifth period t5 of the cycle time while changing the first clock signal CLK1 to the low voltage level and keeping the third clock signal CLK3 and the input signal IN to the low voltage level. The step further includes keeping the first node at the low voltage level VGL, the second node and the third node at the high voltage level VGH. The step also includes outputting the first output signal at the low voltage level VGL and the second output signal at the high voltage level VGH in response to the voltages set at the first node, the second node, and the third node. The outputs of the gate on array unit circuit in the fifth period t5 are substantially the same as those in the fourth period t4.

Moreover, the method includes a step of providing the third clock signal CLK3 again at the high voltage level to start a sixth period t6, or optionally a last period of the cycle time, while changing the second clock signal CLK2 to the low voltage level and keeping the first clock signal CLK1 and the input signal IN at the low voltage level. The step also includes keeping the first node at the low voltage level VGL, the second node and the third node at the high voltage level VGH. The step also includes outputting the first output signal at the low voltage level VGL and the second output signal at the high voltage level VGH in response to the voltages set at the first node, the second node, and the third node. The outputs of the gate on array unit circuit in the sixth period t6 are substantially the same as those in the fourth period t4 and in the fifth period t5.

It is merely an example to have each of the three clock signals to have ⅓ duty cycle, as shown in FIG. 12. In the present disclosure, the method for driving the GOA unit circuit as shown in FIGS. 1 through 10 does not require each clock signal to have ⅓ duty cycle. Additionally, although FIG. 12 shows that the rising edge of the second clock signal CLK2 is substantially simultaneous with the falling edge of the first clock signal CLK1 and the falling edge of the second clock signal CLK2 is substantially simultaneous with the rising edge of the third clock signal, it is merely one example. In fact, a falling edge of one clock signal does not have to be aligned with a rising edge of another clock signal. In general, the first output signal is outputted with a high-voltage pulse with its rising edge and falling edge substantially aligned to those of the second clock signal. The second output signal is outputted with a negative pulse with its falling edge aligned with the rising edge of the first clock signal and its rising edge aligned with the rising edge of the third clock signal. Therefore, if the rising edge of the third clock signal is delayed from the falling edge of the second clock signal, the second output signal is outputted at the high voltage level also at a delayed time after the first output signal drops to a low voltage level. However, this delay will not affect the application of the first output signal as a gate-driving signal to drive image data loading while the second output signal as an emission-control signal to control LED light emission.

Figure 11:
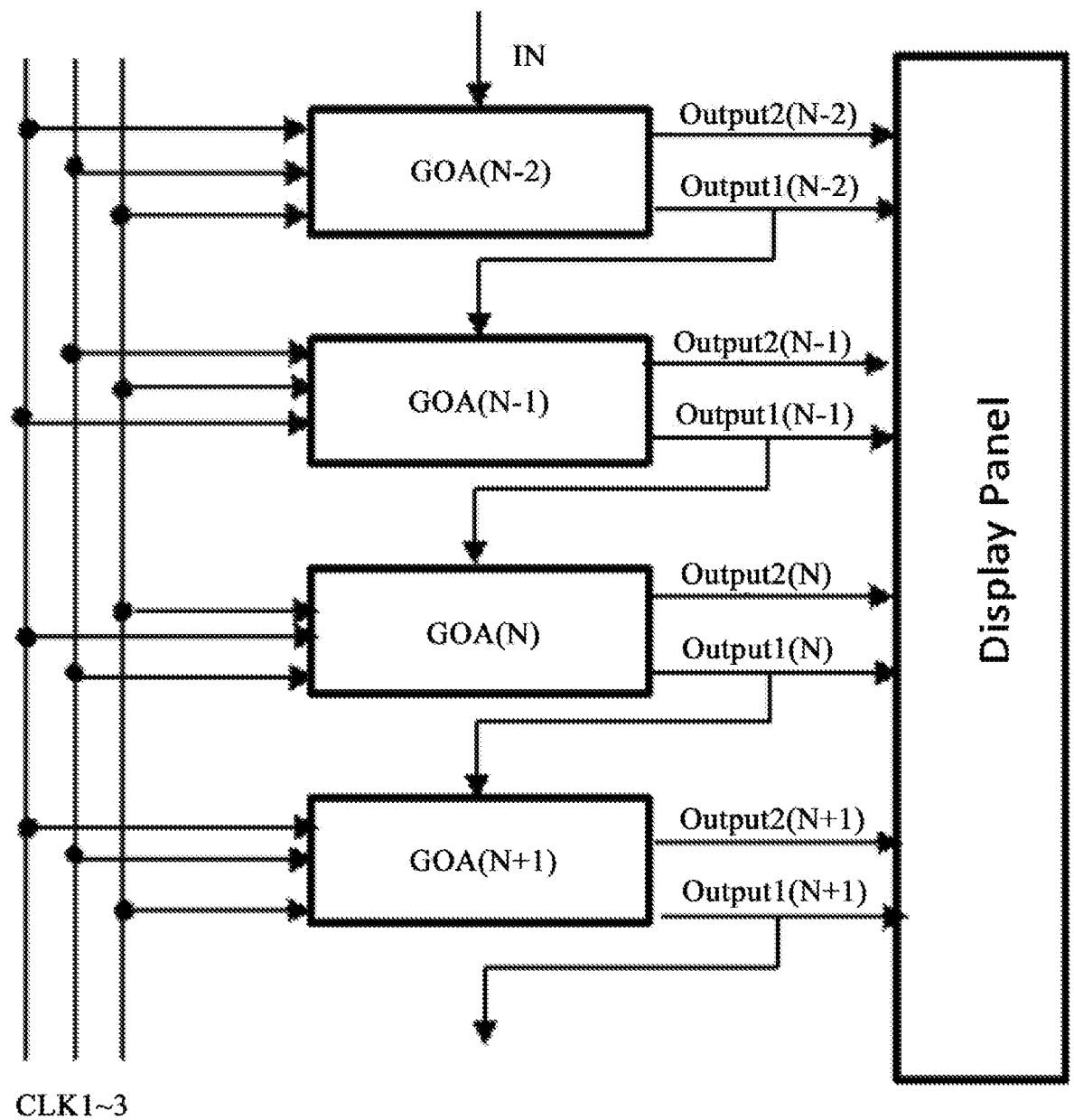
FIG. 11 is a schematic diagram of a GOA circuit with cascaded multiple stages of gate on array unit circuits according to an embodiment of the present disclosure.

In another aspect, the present disclosure provides a gate-driving circuit or a gate on array (GOA) circuit by cascading multiple stages of gate on array unit circuits described herein. FIG. 11 shows a schematic diagram of a GOA circuit with cascaded multiple stages of gate on array unit circuits according to an embodiment of the present disclosure. Referring to FIG. 11, the GOA circuit is cascaded by a series of gate on array unit circuits, such as a (N−2)-th stage GOA(N−2) unit circuit, a (N−1)-th stage GOA(N−1) unit circuit, a N-th stage GOA(N) unit circuit, a (N+1)-th stage GOA(N+1) unit circuit, and so on. A respective one GOA (N) unit circuit of the multiple stages of gate on array unit circuits includes a gate on array unit circuit of FIG. 1 (or any one in FIGS. 2-10) described herein configured to be driven by three clock signals received respectively via three clock-signal lines CLK1-3. For example, the (N−2)-th stage GOA (N−2) unit circuit receives a first clock signal from a first clock-signal line CLK1, a second clock signal from a second clock-signal line CLK2, and a third clock signal from a third clock-signal line CLK3. The next stage GOA(N−1) unit circuit receives the first clock signal from the second clock-signal line CLK2, the second clock signal from the third clock-signal line CLK3, and the third clock signal from the first clock-signal line CLK3.

In the embodiment, a present stage GOA(N) unit circuit is configured to output a first output signal Output1(N) and a second output signal Output2(N) to a display panel for driving a row of subpixel circuits (not shown). The first output signal Output1(N) is a voltage pulse at a turn-on voltage level in one period of an operation cycle time associated with an input signal IN. The second output signal Output2(N) is a voltage pulse at the turn-off voltage level at least in the same one period of the cycle time before rising to the turn-on voltage level after the first output signal drops to the turn-off voltage level. In another embodiment, the cascaded structure of FIG. 11 for the multiple stages of the GOA unit circuits is configured to have the first output signal Output1(N−1) from a GOA(N−1) unit circuit in a previous stage, which is inputted into a GOA(N) unit circuit in a present stage as the input signal at the turn-on voltage level. The cascaded structure of the GOA circuit shown in FIG. 11 is directly associated with the timing waveform of three clock signals provided as in FIG. 12 and employed to drive each stage of GOA unit circuit in the GOA circuit.

Figure 13:
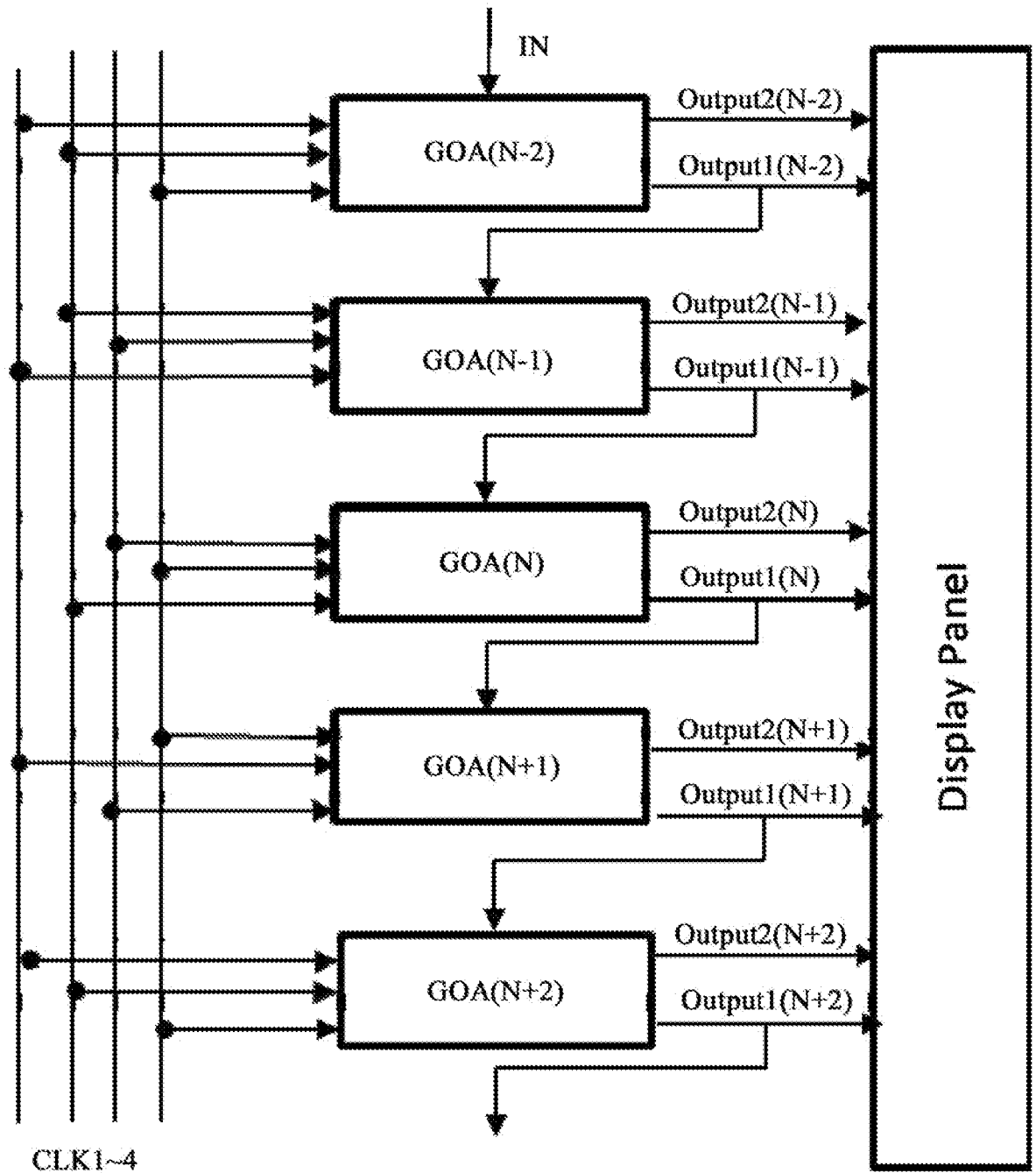
FIG. 13 is a schematic diagram of a GOA circuit with multiple cascaded gate on array unit circuits according to another embodiment of the present disclosure.

In another embodiment, an alternative cascaded structure of multiple stages of gate on array unit circuits driven by three clock signals selected from four clock-signal lines CLK1-4 is shown in FIG. 13. Each GOA unit circuit in the GOA circuit is substantially the same as that in any one of FIGS. 1 to 10 described herein. This cascaded structure of the GOA circuit shown in FIG. 13 is directly associated with another timing waveform of four clock signals provided as in FIG. 14. Three of the four clock signals are alternately selected to drive one stage of GOA unit circuits in the GOA circuit. For example, the cascaded series as shown sequentially includes a (N−2)-th stage GOA(N−2) unit circuit, a (N−1)-th stage GOA(N−1) unit circuit, a N-th stage GOA (N) unit circuit, a (N+1)-th stage GOA(N+1) unit circuit, a (N+2)-th stage GOA(N+2) unit circuit, and so on. In particular, referring to FIG. 13, the (N−2)-th stage GOA unit circuit is configured to receive a first clock signal from a first clock-signal line CLK1, a second clock signal from a second clock-signal line CLK2, and a third clock signal from a fourth clock-signal line CLK4. The (N−1)-th stage GOA unit circuit is next in the series configured to receive a first clock signal from the second clock-signal line CLK2, a second clock signal from a third clock-signal line CLK3, and a third clock signal from the first clock-signal line CLK1. The next N-th stage GOA unit circuit in the series is configured to receive a first clock signal from the third clock-signal line CLK3, a second clock signal from the fourth clock-signal line CLK4, and a third clock signal from the second clock-signal line CLK2. The next (N+1)-th stage GOA unit circuit in the series is configured to receive a first clock signal from the fourth clock-signal line CLK4, a second clock signal from the first clock-signal line CLK1, and a third clock signal from the third clock-signal line CLK3.

Figure 14:
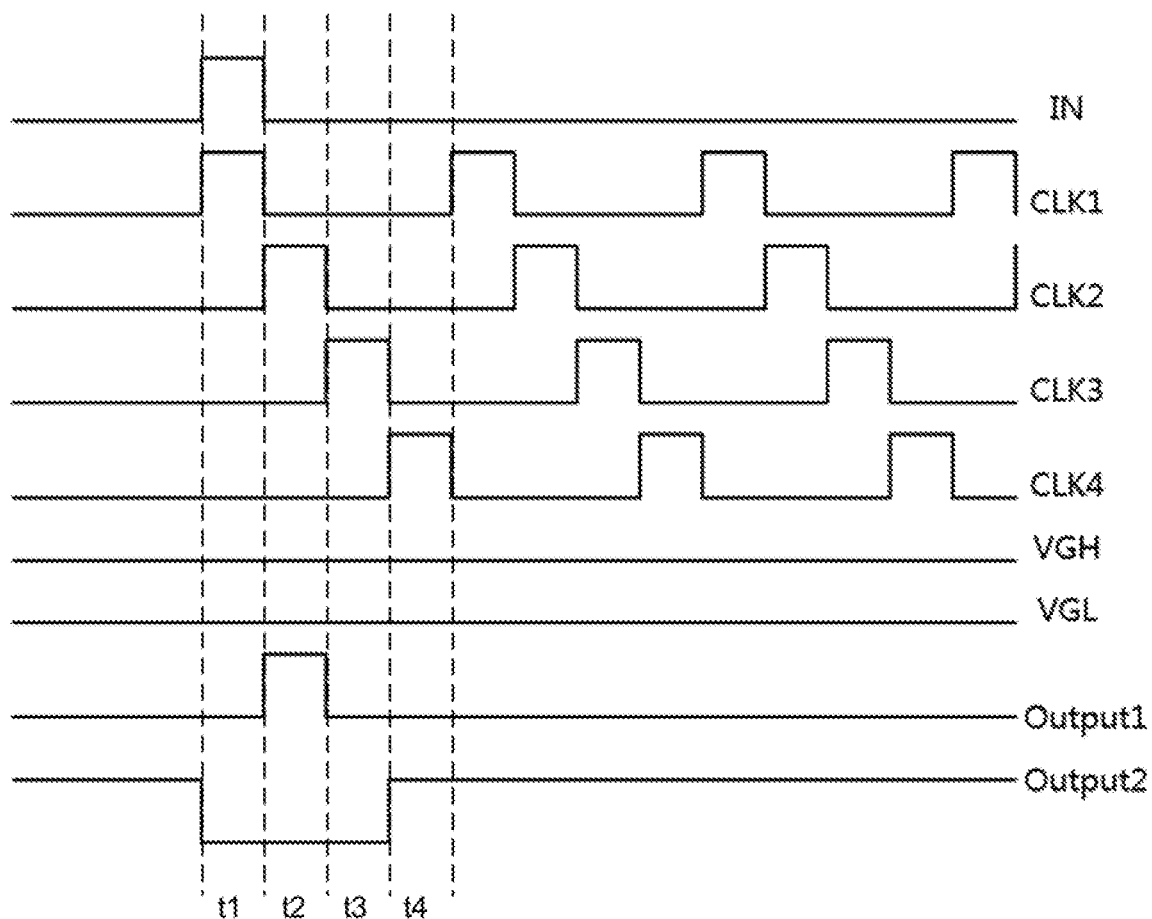
FIG. 14 is a timing waveform diagram of control signals for driving the gate on array unit circuit to output two output signals according to another embodiment of the present disclosure.

FIG. 14 shows a timing waveform diagram of control signals for driving the gate on array unit circuit to output two output signals based on four clock signals and one input signal according to another embodiment of the present disclosure. The timing waveform sets a foundation of driving a respective one of the multiple GOA unit circuits in the cascaded series of FIG. 13. The GOA unit circuit is substantially the same as one described herein, as shown as in FIGS. 1 to 10, where three clock signals are employed to drive its operation. While from the point of view of the cascaded multiple stages of the GOA unit circuit, the three clock signals are alternatively selected out of the four clock signals supplied to the four clock-signal lines coupled to the cascaded GOA circuit. Referring to FIG. 14, a high voltage level pulse of the first output signal Output1 outputted from a respective GOA unit circuit is still substantially in-phase (aligned with) the rising edge and the falling edge of the second clock signal CLK2. A low voltage level pulse of the second output signal Output2 outputted from the same GOA unit circuit has its falling edge aligned with the rising edge of the first clock signal CLK1 and its rising edge (later in time) aligned with the rising edge of the fourth clock signal. The rising edge of Output2 has a time delay relative to the falling edge of Output1.

In yet another aspect, the present disclosure provides a display apparatus including a display panel having multiple rows of subpixel circuits. Each subpixel circuit includes a light-emitting diode configured to emit light for image display. The display apparatus also includes a gate on array (GOA) circuit described herein with multiple GOA unit circuits cascaded in series. Each GOA unit circuit is one described in the present disclosure and is configured to output a first output signal to drive data loading to a respective one row of subpixel circuits and output a second output signal to control light emission of the light-emitting diodes in the respective one row of subpixel circuits.

Optionally, the display panel is an active-matrix organic light emitting diode (AMOLED) display wherein the light emitting diode in each subpixel circuit is an organic light-emitting diode. Optionally, the light emitting diode in each subpixel circuit is a micro light-emitting diode.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A gate on array unit circuit comprising:
   an input sub-circuit connected to a first node and configured to set a turn-on voltage level to the first node in response to an input signal and a first clock signal;
   a first pull-down sub-circuit connected to a second node and the first node, and configured to pull down a voltage level at the second node to a turn-off voltage level in response to the turn-on voltage level at the first node;
   a pull-up sub-circuit connected to the second node and configured to set the turn-on voltage level to the second node in response to a third clock signal;
   a first control sub-circuit connected to the second node and a third node and configured to set a turn-on voltage level to the third node in response to the turn-on voltage level at the second node;
   a second control sub-circuit connected to the first node and the third node, and configured to set a turn-off voltage level to the third node in response to the turn-on voltage level at the first node;
   a first output sub-circuit configured to output a first output signal at the turn-on voltage level triggered by a second clock signal through one period of a cycle time associated with the input signal in response to voltage levels at the second node and the first node; and
   a second output sub-circuit configured to output a second output signal falling to the turn-off voltage level triggered by the first clock signal through at least the same one period of the cycle time before rising to the turn-on voltage level triggered by the third clock signal in response to voltage levels at the first node and the third node;
   wherein the second output sub-circuit comprises a thirteenth transistor, a fourteenth transistor, a third capacitor, and a fourth capacitor, the thirteenth transistor, the fourteenth transistor and the third capacitor are respectively coupled to a second output terminal for outputting the second output signal; the thirteenth transistor having a first terminal configured to receive a first voltage signal set at the turn-on voltage level, a gate terminal coupled to the third node, and a second terminal coupled to the second output terminal; the fourteenth transistor having a first terminal configured to receive a second voltage signal set at the turn-off voltage level, a gate terminal coupled to the first node, and a second terminal coupled to the second output terminal; the third capacitor having a first terminal coupled to the third node and a second terminal coupled to the second output terminal; and the fourth capacitor having a first terminal coupled to the first node and a second terminal coupled to the first terminal of the fourteenth transistor.

2. The gate on array unit circuit of claim 1, further comprising a second pull-down sub-circuit connected to the second node and the first node, and configured to pull down a voltage level at the first node to a turn-off voltage level in response to the turn-on voltage level at the second node.

3. The gate on array unit circuit of claim 2, wherein the second pull-down sub-circuit comprises a seventh transistor having a first terminal configured to receive a second voltage signal set at the turn-off voltage level, a gate terminal coupled to the second node, and a second terminal coupled to the first node.

4. The gate on array unit circuit of claim 1, further comprising a third pull-down sub-circuit connected to the first node and the third node, and configured to pull down a voltage level at the first node to a turn-off voltage level in response to the turn-on voltage level at the third node.

5. The gate on array unit circuit of claim 4, wherein the third pull-down sub-circuit comprises an eleventh transistor having a first terminal configured to receive a second voltage signal set at the turn-off voltage level, a gate terminal coupled to the third node, and a second terminal coupled to the first node.

6. The gate on array unit circuit of claim 1, wherein the input sub-circuit comprises a first transistor and a second transistor, the first transistor having a first terminal configured to receive a first voltage signal set at the turn-on voltage level, a gate terminal configured to receive the input signal, and a second terminal; the second transistor having a first terminal coupled to the second terminal of the first transistor, a gate terminal configured to receive the first clock signal, and a second terminal coupled to the first node.

7. The gate on array unit circuit of claim 6, wherein the input sub-circuit further comprises a fifth transistor having a first terminal configured to receive a second voltage signal set at the turn-off voltage level, a gate terminal configured to receive the input signal, and a second terminal coupled to the second node.

8. The gate on array unit circuit of claim 1, wherein the pull-up sub-circuit comprises a fourth transistor having a first terminal configured to receive a first voltage signal set at the turn-on voltage level, a gate terminal configured to receive the third clock signal, and a second terminal coupled to the second node.

9. The gate on array unit circuit of claim 1, wherein the first control sub-circuit comprises a tenth transistor having a first terminal configured to receive a first voltage signal set at the turn-on voltage level, a gate terminal coupled to the second node, and a second terminal coupled to the third node.

10. The gate on array unit circuit of claim 1, wherein the second control sub-circuit comprises a twelfth transistor having a first terminal configured to receive a second voltage signal set at the turn-off voltage level, a gate terminal coupled to the first node, and a second terminal coupled to the third node.

11. The gate on array unit circuit of claim 1, wherein the first pull-down sub-circuit comprises a third transistor having a first terminal configured to receive a second voltage signal set at the turn-off voltage level, a gate terminal coupled to the first node, and a second terminal coupled to the second node.

12. The gate on array unit circuit of claim 1, wherein the first output sub-circuit comprises a ninth transistor, a sixth transistor, and a first capacitor respectively coupled to a first output terminal for outputting the first output signal; the ninth transistor having a first terminal configured to receive the second clock signal, a gate terminal coupled to a first terminal of the first capacitor, and a second terminal coupled to the first output terminal; the sixth transistor having a first terminal configured to receive a second voltage signal set at the turn-off voltage level, a gate terminal coupled to the second node, and a second terminal coupled to the first output terminal; and the first capacitor having a second terminal coupled to the first output terminal.

13. The gate on array unit circuit of claim 12, wherein the first output sub-circuit further comprises an eighth transistor having a first terminal coupled to the first node, a gate terminal configured to receive a first voltage signal set at the turn-on voltage level, and a second terminal coupled to the first terminal of the first capacitor and the gate terminal of the ninth transistor.

14. A gate on array circuit comprising multiple gate on array unit circuits in a cascaded series associated with at least three clock-signal lines, a respective one of the multiple gate on array unit circuits comprising a gate on array unit circuit of claim 1 configured to output a first output signal at a turn-on voltage level in one period of a cycle time associated with an input signal and a second output signal at the turn-off voltage level at least in the same one period of the cycle time before rising to the turn-on voltage level after the first output signal drops to the turn-off voltage level;
wherein the first output signal from a gate on array unit circuit in a previous stage in the cascaded series is inputted into a gate on array unit circuit in a present stage in the cascaded series as the input signal at the turn-on voltage level.

15. The gate on array circuit of claim 14, wherein,
the gate on array unit circuit in (N−2)-th stage is configured to receive a first clock signal from a first one of the three clock-signal lines, a second clock signal from a second one of the three clock-signal lines, and a third clock signal from a third one of the three clock-signal lines;
the gate on array unit circuit in (N−1)-th stage is configured to receive a first clock signal from the second one of the three clock-signal lines, a second clock signal from the third one of the three clock-signal lines, and a third clock signal from the first one of the three clock-signal lines; and
the gate on array unit circuit in N-th stage is configured to receive a first clock signal from the third one of the three clock-signal lines, a second clock signal from the first one of the three clock-signal lines, and a third clock signal from the second one of the three clock-signal lines.

16. The gate on array circuit of claim 14, wherein the cascaded series is associated with four clock-signal lines; wherein, the gate on array unit circuit in (N−2)-th stage is configured to receive a first clock signal from a first one of the four clock-signal lines, a second clock signal from a second one of the four clock-signal lines, and a third clock signal from a fourth one of the four clock-signal lines;
the gate on array unit circuit in (N−1)-th stage is configured to receive a first clock signal from the second one of the four clock-signal lines, a second clock signal from a third one of the four clock-signal lines, and a third clock signal from the first one of the four clock-signal lines;
the gate on array unit circuit in N-th stage is configured to receive a first clock signal from the third one of the four clock-signal lines, a second clock signal from the fourth one of the four clock-signal lines, and a third clock signal from the second one of the four clock-signal lines; and
the gate on array unit circuit in (N+1)-th stage is configured to receive a first clock signal from the fourth one of the four clock-signal lines, a second clock signal from the first one of the four clock-signal lines, and a third clock signal from the third one of the four clock-signal lines.

17. A display apparatus comprising a display panel having multiple rows of subpixel circuits including light-emitting diodes and a gate on array circuit of claim 14 with multiple gate on array unit circuits cascaded in series, wherein a respective one of the multiple gate on array unit circuits is configured to output a first output signal to drive data loading to a respective one row of subpixel circuits and a second output signal to control the light-emitting diodes thereof.

18. A gate on array unit circuit comprising:
an input sub-circuit connected to a first node and configured to set a turn-on voltage level to the first node in response to an input signal and a first clock signal;
a first pull-down sub-circuit connected to a second node and the first node, and configured to pull down a voltage level at the second node to a turn-off voltage level in response to the turn-on voltage level at the first node;
a pull-up sub-circuit connected to the second node and configured to set the turn-on voltage level to the second node in response to a third clock signal;
a first control sub-circuit connected to the second node and a third node and configured to set a turn-on voltage level to the third node in response to the turn-on voltage level at the second node;
a second control sub-circuit connected to the first node and the third node, and configured to set a turn-off voltage level to the third node in response to the turn-on voltage level at the first node;
a first output sub-circuit configured to output a first output signal at the turn-on voltage level triggered by a second clock signal through one period of a cycle time associated with the input signal in response to voltage levels at the second node and the first node;

a second output sub-circuit configured to output a second output signal falling to the turn-off voltage level triggered by the first clock signal through at least the same one period of the cycle time before rising to the turn-on voltage level triggered by the third clock signal in response to voltage levels at the first node and the third node; and a second capacitor having a first terminal configured to receive a first voltage signal set at the turn-on voltage level and a second terminal coupled to the second node.

19. A method of driving a gate on array unit circuit in a cycle time, wherein transistors of the gate on array unit circuit are N-type transistors, the gate on array unit circuit is configured to receive a first voltage signal set at a high or turn-on voltage level for the N-type transistor and a second voltage signal set at a low or turn-off voltage level for the N-type transistor, the method comprising:

providing a first clock signal and an input signal at a high voltage level to an input sub-circuit to start a first period of the cycle time while keeping a second clock signal to a first output sub-circuit and a third clock signal to a pull-up sub-circuit at a low voltage level, thereby setting a first node to the high voltage level, a second node to the low voltage level, and a third node to the low voltage level, and outputting a first output signal at the low voltage level and a second output signal at the low voltage level;

providing a second clock signal at the high voltage level to start a second period of the cycle time while changing the first clock signal and the input signal to the low voltage level and keeping the third clock signal at the low voltage level, thereby keeping the first node at the high voltage level, the second node at the low voltage level, and the third node at the low voltage level, and outputting the first output signal at the high voltage level and the second output signal at the low voltage level;

providing a third clock signal at the high voltage level to start a third period of the cycle time while keeping the first clock signal, the second clock signal, and the input signal at the low voltage level, thereby setting the second node to the high voltage level, the third node to the high voltage level and changing the first node to the low voltage level, and outputting the first output signal at the low voltage level and the second output signal at the high voltage level;

providing the first clock signal again at the high voltage level to start a fourth period of the cycle time while keeping the second clock signal, the input signal, and the third clock signal at the low voltage level, thereby keeping the first node at the low voltage level, the second node and the third node at the high voltage level, and outputting the first output signal at the low voltage level and the second output signal at the high voltage level;

providing the second clock signal again at the high voltage level to start a fifth period of the cycle time while changing the first clock signal to the low voltage level and keeping the third clock signal and the input signal to the low voltage level, thereby keeping the first node at the low voltage level, the second node and the third node at the high voltage level, and outputting the first output signal at the low voltage level and the second output signal at the high voltage level; and providing the third clock signal again at the high voltage level to start a sixth period of the cycle time while changing the second clock signal to the low voltage level and keeping the first clock signal and the input signal at the low voltage level, thereby keeping the first node at the low voltage level, the second node and the third node at the high voltage level, and outputting the first output signal at the low voltage level and the second output signal at the high voltage level;

wherein the gate on array unit circuit further comprises a second output sub-circuit the second output sub-circuit comprises a thirteenth transistor, a fourteenth transistor, a third capacitor, and a fourth capacitor;

wherein the method further comprises:

coupling the thirteenth transistor, the fourteenth transistor and the third capacitor are respectively to a second output terminal for outputting the second output signal;

providing the first voltage signal set at the turn-on voltage level to a first terminal of the thirteenth transistor;

coupling a gate terminal of the thirteenth transistor to the third node;

coupling a second terminal of the thirteenth transistor to the second output terminal;

providing the second voltage signal set at the turn-off voltage level to a first terminal of the fourteenth transistor;

coupling a gate terminal of the fourteenth transistor to the first node;

coupling a second terminal of the fourteenth transistor to the second output terminal;

coupling a first terminal of the third capacitor to the third node;

coupling a second terminal of the third capacitor to the second output terminal;

coupling a first terminal of the fourth capacitor to the first node; and coupling a second terminal of the fourth capacitor to the first terminal of the fourteenth transistor.

\* \* \* \* \*